(12) United States Patent
Choi et al.

(10) Patent No.: US 11,758,799 B2
(45) Date of Patent: Sep. 12, 2023

(54) DISPLAY DEVICE AND METHOD OF MANUFACTURING THE SAME

(71) Applicant: Samsung Display Co., Ltd., Yongin-Si (KR)

(72) Inventors: Min Hee Choi, Hwaseong-si (KR); Chung Yi, Hwaseong-si (KR); Yun Kyeong In, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 56 days.

(21) Appl. No.: 17/489,631

(22) Filed: Sep. 29, 2021

(65) Prior Publication Data

US 2022/0020941 A1    Jan. 20, 2022

Related U.S. Application Data

(62) Division of application No. 16/813,541, filed on Mar. 9, 2020, now Pat. No. 11,158,825.

(30) Foreign Application Priority Data

Mar. 20, 2019    (KR) .......................... 10-2019-0031673

(51) Int. Cl.
*H01L 51/56*         (2006.01)
*H10K 77/10*         (2023.01)
(Continued)

(52) U.S. Cl.
CPC ....... *H10K 77/111* (2023.02); *H10K 50/8428* (2023.02); *H10K 59/122* (2023.02); *H10K 59/1213* (2023.02); *H10K 59/1216* (2023.02); *H10K 59/131* (2023.02); *H10K 71/00* (2023.02); *H01L 27/124* (2013.01); *H01L 27/1218* (2013.01); *H01L 27/1255* (2013.01); *H01L 27/1262* (2013.01); *H10K 59/1201* (2023.02); *H10K 2102/311* (2023.02)

(58) Field of Classification Search
CPC ............. H01L 27/3246; H01L 27/3276; H01L 27/3248; H01L 51/0097; H01L 51/525; H01L 51/56; H01L 27/1218; H01L 27/124
USPC .......................................................... 257/71
See application file for complete search history.

(56) References Cited

U.S. PATENT DOCUMENTS

2014/0097408 A1*  4/2014  Kim .................... H01L 27/3237
                                                          257/40
2014/0232956 A1*  8/2014  Kwon ............... G02F 1/133305
                                                          349/12
(Continued)

FOREIGN PATENT DOCUMENTS

KR    10-2017-0091244 A    8/2017
KR    10-2017-0092173 A    8/2017
(Continued)

*Primary Examiner* — Dzung Tran
(74) *Attorney, Agent, or Firm* — Innovation Counsel LLP

(57) ABSTRACT

A display device may include a substrate, pixels, and a crack mitigation structure. The substrate may include a main region, a sub-region, and a bending region. The bending region may be connected between the main region and the sub-region and may include a curved outline section. The pixels may be disposed on the main region. The crack mitigation structure may be disposed on the bending region. A section of the crack mitigation structure may be substantially parallel to the curved outline section.

4 Claims, 15 Drawing Sheets

(51) Int. Cl.
   *H10K 50/842*   (2023.01)
   *H10K 59/122*   (2023.01)
   *H10K 59/131*   (2023.01)
   *H10K 59/121*   (2023.01)
   *H10K 71/00*    (2023.01)
   H01L 27/12      (2006.01)
   H10K 59/12      (2023.01)
   H10K 102/00     (2023.01)

(56) References Cited

U.S. PATENT DOCUMENTS

| | | |
|---|---|---|
| 2014/0306348 A1 | 10/2014 | Ahn |
| 2015/0036299 A1 | 2/2015 | Namkung et al. |
| 2016/0035812 A1 | 2/2016 | Kwon et al. |
| 2016/0315284 A1 | 10/2016 | Jeon |
| 2017/0117502 A1 | 4/2017 | Park |
| 2017/0346041 A1 | 11/2017 | Kim et al. |
| 2018/0040633 A1 | 2/2018 | Lee et al. |

FOREIGN PATENT DOCUMENTS

| | | | |
|---|---|---|---|
| KR | 10-2017-0128683 A | 11/2017 | |
| KR | 10-2018-0030326 A | 3/2018 | |
| KR | 10-2018-0049469 A | 5/2018 | |

\* cited by examiner

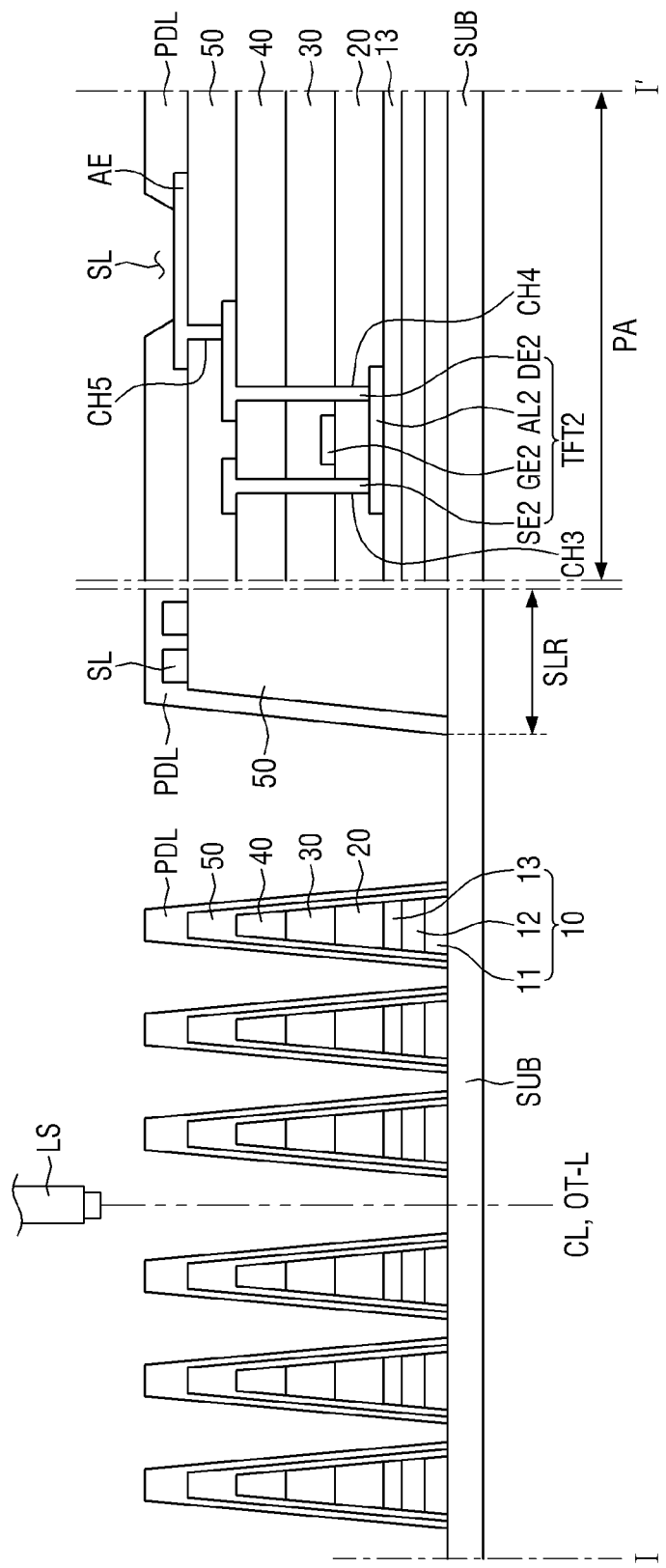

DISPLAY DEVICE AND METHOD OF MANUFACTURING THE SAME

This application is a divisional application of U.S. patent application Ser. No. 16/813,541 filed Mar. 9, 2020, which claims priority to Korean Patent Application No. 10-2019-0031673 filed on Mar. 20, 2019 in the Korean Intellectual Property Office; the disclosure of the Korean Patent Application is incorporated herein by reference in its entirety.

BACKGROUND

1. Field

The technical field relates to a display device and a method for manufacturing the display device.

2. Description of the Related Art

Modern display devices include liquid crystal display devices and organic light-emitting diode display devices. A display device may include a display region and a bent region. The display region may include pixels for displaying images. The bent region may be implemented for minimizing the overall size of the display device. Because of continuous stress, a crack may occur in the bent region. The crack may propagate toward the display region and may adversely affect the performance and/or durability of the display device.

SUMMARY

Embodiments may minimize propagation of a crack in a bending region of a display device.

An embodiment of a display device includes a substrate, which includes a main region including a display region, a sub-region including pads, and a bending region disposed between the main region and the sub-region and including two outlines of which at least one outline includes a curved portion, wherein the bending region includes a structure disposed to be substantially parallel to the curved portion.

An embodiment of a method of manufacturing a display device, the method includes: forming at least one barrier layer on a substrate on which a main region and a bending region are defined, wherein the main region includes a display region and the bending region extends from one side of the main region and has two outlines of which at least one outline includes a curved portion; forming at least one inorganic layer on the barrier layer; etching the at least one barrier layer and the at least one inorganic layer in the bending region to form crack prevention dams including at least one barrier layer and at least one inorganic layer; and cutting a boundary between the crack prevention dams on the substrate using a laser.

An embodiment may be related to a display device. The display device may include a substrate, pixels, and a structure. The substrate may include a main region, a sub-region, and a bending region. The bending region may be connected between the main region and the sub-region and may include a curved outline section. The pixels may be disposed on the main region. The structure may be disposed on the bending region. A section of the structure may be substantially parallel to the curved outline section.

A first end of the structure may be positioned closer to the main region and farther from a center of the bending region than a second end of the structure.

The structure may include dams. The dams may be spaced from each other and may include a dam. A section of the dam may be substantially parallel to the curved outline section of the bending region.

The dam may include an inorganic layer.

The inorganic layer may include at least one of a first insulating layer, a second insulating layer, and a third insulating layer.

The display device may include a first organic layer overlapping the bending region. The display device may include a signal line provided on the first organic layer.

The display device may include a driving chip. The driving chip may be disposed on the sub-region and may be electrically connected through the signal line to at least one of the pixels.

The display device may include a second organic layer disposed on the first organic layer and covering the signal line.

The dam may include at least one of a first organic part and a second organic part. A material of the first organic part may be identical to a material of the first organic layer. A material of the second organic part may be identical to a material of the second organic layer.

The dam may include an inorganic part. The inorganic part may be positioned between the bending region and the first organic part and/or the second organic part.

The first organic layer may be spaced from the dams.

The bending region may be partially exposed between the dam and the first organic layer.

The bending region may be partially exposed between the dams.

The dam may extend continuously from an edge of the main region to an edge of the sub-region.

The dams may be spaced from each other in a first direction and may be spaced from one another in a second direction different from the first direction.

The dam may have a trapezoidal shape in a plan view of the bending region and may be a first dam. The dams may include a second dam and a third dam. No intervening dam may be positioned between the first dam the second dam. No intervening dam may be positioned between the second dam and the third dam. The first dam, the second dam, and the third dam may not be all aligned.

An embodiment may be related to a method for manufacturing a display device. The method may include forming a barrier layer on a substrate. The substrate may include a main region and a neighboring region. The neighboring region may be directly connected to the main region. The barrier layer may include a first barrier section and a second barrier section. The first barrier section may overlap the main region. The second barrier section may overlap the neighboring region. The method may include forming transistors that overlap the first barrier section. The method may include forming an inorganic layer on the barrier layer. The inorganic layer may include a first inorganic section and a second inorganic section. The first inorganic section may overlap the first barrier section. The second inorganic section may overlap the second barrier section. The method may include etching at least the second barrier section and the second inorganic section to form dams. Each of the dams may include a remaining portion of the second barrier section and a remaining portion of the second inorganic section. The method may include cutting the neighboring region at a location between two of the dams using a laser to form a bending region. The bending region may include a curved outline section.

The method may include the following steps: forming an insulating film on remaining portions of the second inorganic section; and etching the insulating film at locations between the remaining portions of the second inorganic section.

The method may include the following steps: forming a pixel definition layer on remaining portions of the insulating film; and etching the pixel definition layer at locations between the remaining portions of the insulating film.

The bending region may be partially exposed between remaining dams of the dams.

An embodiment may be related to a method for manufacturing a display device. The method may include the following steps: forming an insulating layer on a substrate, wherein the substrate may include a main region and a neighboring region, wherein the neighboring region may be directly connected to the main region, wherein the insulating layer may include a first insulating section and a second insulating section, wherein the first insulating section may overlap the main region, and wherein the second insulating section may overlap the neighboring region; forming transistors that overlap the first insulating section; etching at least the second insulating section to form dams, wherein each of the dams may include a remaining portion of the second insulating section; and cutting the neighboring region at a location between two of the dams using a laser to form a bending region, wherein the bending region may include a curved outline section.

The method may include the following steps: forming an insulating film on remaining portions of the second insulating section; and etching the insulating film at locations between the remaining portions of the second insulating section.

The method may include the following steps: forming a pixel definition layer on remaining portions of the insulating film; and etching the pixel definition layer at locations between the remaining portions of the insulating film.

The bending region may be partially exposed between remaining dams of the dams.

Embodiments may minimize propagation of a crack in a display device.

BRIEF DESCRIPTION OF THE DRAWINGS

FIG. 15 is a cross-sectional view illustrating a main region and a bending region according to an embodiment.

DETAILED DESCRIPTION OF EMBODIMENTS

Figure 1:
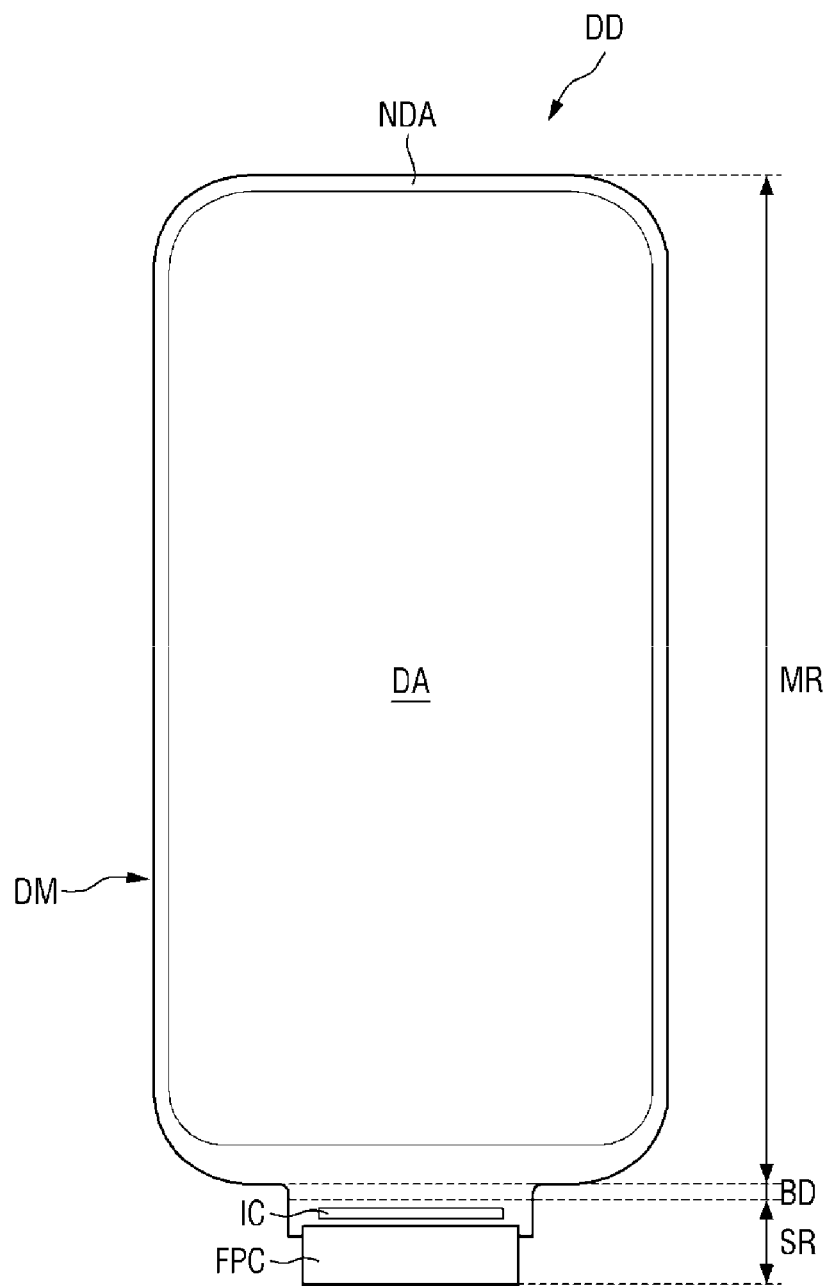
FIG. 1 is a plan/layout view illustrating a display device according to an embodiment.

Example embodiments are described with reference to the accompanying drawings. Practical embodiments may be embodied in different forms and should not be construed as limited to the example embodiments.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element.

Spatially relative terms, such as "beneath," "below," "lower," "above," "upper" and the like, may be used to describe one element or feature's relationship to another element(s) or feature(s) as illustrated in the figures. The spatially relative terms may encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations), and the spatially relative descriptors should be interpreted accordingly.

Same reference numbers may indicate same or similar components.

In the description, a "layer" may mean a portion of the layer. A list of items may mean at least one of the listed items. The term "prevention" may mean "mitigation." The term "FIG." may be equivalent to "Fig." shown in the drawings. The term "semiconductor pattern" may mean "semiconductor member." The term "any one" may mean "at least one." The term "outline" may mean "perimeter section."

Figure 2:
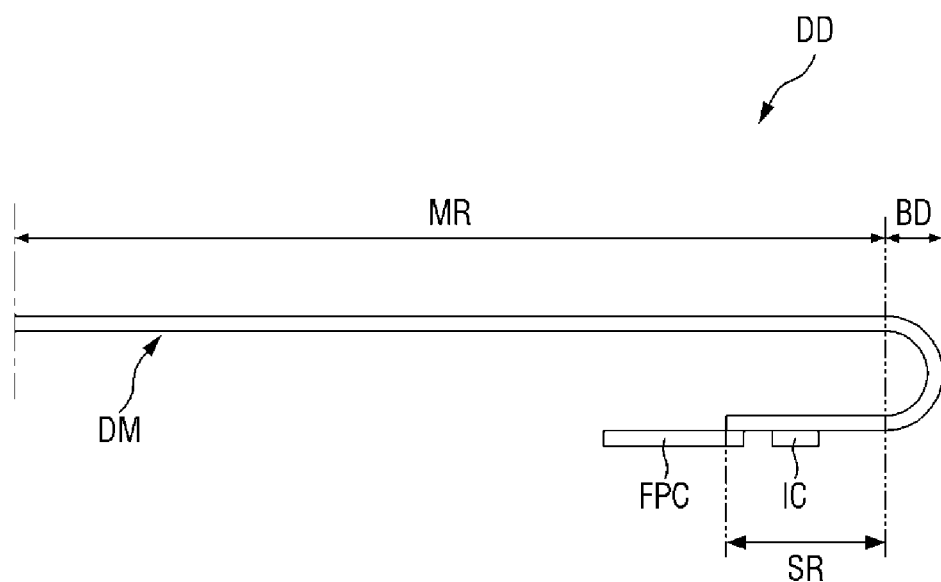
FIG. 2 is a schematic partial cross-sectional view illustrating the display device according to an embodiment.
Figure 3:
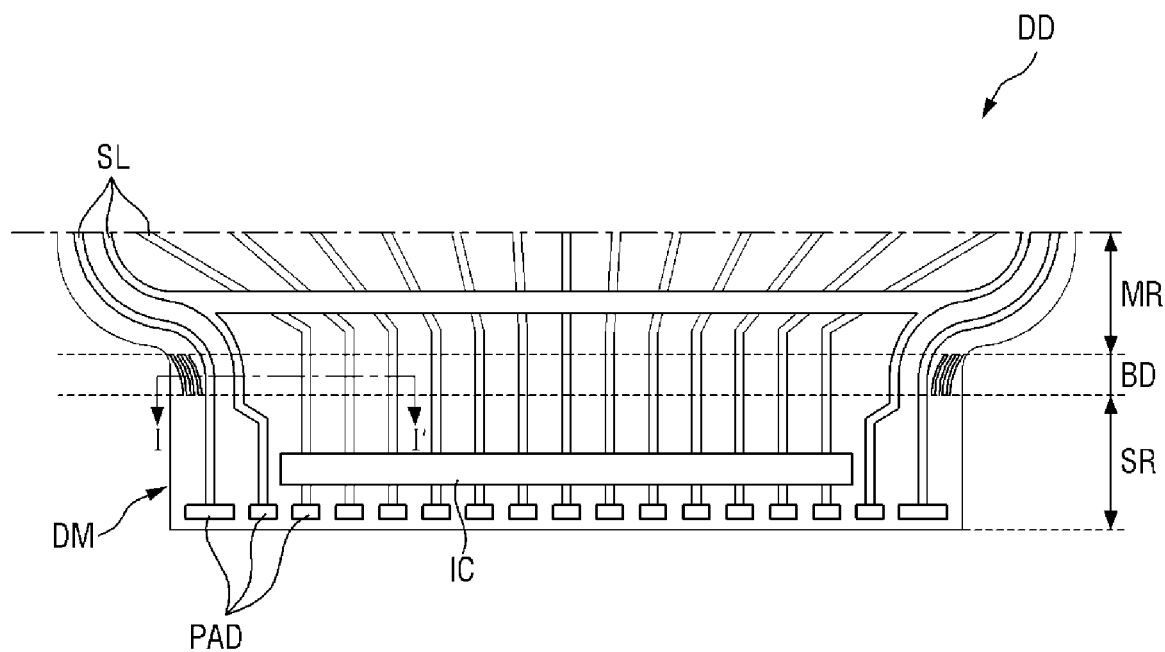
FIG. 3 is a plan/layout view illustrating signal lines in a bending region of a panel according to an embodiment.

FIG. 1 is a plan/layout view illustrating a display device according to an embodiment. FIG. 2 is a schematic partial cross-sectional view illustrating the display device according to an embodiment. FIG. 3 is a plan/layout view illustrating signal lines in a bending region of a panel according to an embodiment.

Referring to FIGS. 1 to 3, a display device DD may display a still image or a moving image. The display device DD may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation device, or an ultra-mobile PC (UMPC) and may be used as a display screen of a television, a notebook, a monitor, a billboard, or a device for Internet of things (JOT). The display device DD may be one of an organic light-emitting diode display, a liquid crystal display device, a plasma display device, a field emission display device, an electrophoretic display device, an electro-wetting display device, a quantum dot light-emitting display device, and a micro light-emitting diode (LED) display device. As an example, the display device may be an organic light-emitting diode display.

The display device DD may include a display panel DM. The display panel DM may include a flexible substrate including a flexible polymer material such as polyimide. Accordingly, the display panel DM may be flexible, bendable, or rollable.

The display panel DM may include a main region MR and a bending region BD connected to one side of the main region MR. The display panel DM may further include a sub-region SR which is connected to the bending region BD. Here, "connected" may mean that the two components are made of one material and have an integrated shape. The sub-region SR overlaps the main region MR after the bending region BD has been bent.

The display region DA of the display panel DM is disposed inside the main region MR and may display images according to input signals. The non-display region NDA of the display panel DM may abut the display region DA and may not display images according to input signals. In an embodiment, in the main region MR, a peripheral edge portion of the display region DA, the entire bending region BD, and the entire sub-region SR may constitute the non-display region NDA. The bending region BD and/or the sub-region SR may also constitute the display region DA.

The main region MR may have a shape that is substantially similar to a planar shape of the display device DD. The main region MR may be/include a flat region. In the main region MR, at least one edge other than an edge (side) connected to the bending region BD may form a curved surface or may be bent in a vertical direction.

The display region DA of the display panel DM may be disposed at a central portion of the main region MR. The display region DA may include a plurality of pixels. Each pixel may include a light-emitting layer and a circuit layer configured to control an amount of light emitted from the light-emitting layer. The circuit layer may include a display line, a display electrode, and at least one transistor. The light-emitting layer may include an organic light-emitting material. The light-emitting layer may be sealed by an encapsulation layer.

The display region DA may have a substantially rectangular shape with or without rounded corners. The display region DA may have one or more of various shapes such as a square shape, other polygonal shapes, a circular shape, and an elliptical shape.

At least a portion of the non-display region NDA may be disposed at a curved or bent edge of the main region MR. At least a portion of the display region DA and/or at least a portion of the non-display region NDA may be disposed at a curved or bent edge of the main region MR.

In the main region MR, the non-display region NDA may be disposed around the display region DA. The non-display region NDA of the main region MR may be span from an outer boundary of the display region DA to an edge of the display panel DM. A signal line SL and/or a driving circuit for applying a signal to the display region DA may be disposed in the non-display region NDA of the main region MR. An outermost black matrix may be disposed in the non-display region NDA of the main region MR.

The bending region BD may be disposed between the main region MR and the sub-region SR, and at least one outline of two outlines OT-L may include a curved portion (i.e., a curved outline section). For example, the two outline lines OT-L of the bending region BD may extend from one side of the main region MR to one side of the sub-region SR and may be curved portions having the same curvature. Distances between the two outline lines OT-L may gradually decrease from the main region MR to the sub-region SR.

In the bending region BD, the display panel DM may be curved, such that the sub-region is disposed behind the main region MR without blocking a display surface of the display area DA. The bending region BD may have a certain radius of curvature. The bending region BD may have different radii of curvature for different sections. As the display panel DM is bent in the bending region BD, a surface of the display panel DM facing upward may be changed to face outward and then face downward.

The sub-region SR extends from the bending region BD. The sub-region SR may extend parallel to the main region MR after bending of the bending region BD is completed. The sub-region SR may overlap the main region MR in the thickness direction of the display panel DM. The sub-region SR may overlap the non-display region NDA and the display region DA of the main region MR.

A width of the sub-region SR may be equal to a (minimum) width of the bending region BD.

A driving chip IC may be disposed in the sub-region SR of the display panel DM. The driving chip IC may include an integrated circuit configured to drive the display panel DM. In an embodiment, the integrated circuit may be a data drive integrated circuit which generates and supplies a data signal. The driving chip IC may be mounted on the display panel DM in a sub-region SR. The driving chip IC is mounted on one surface of the display panel DM that is the same surface as the display surface. The driving chip IC is mounted on a surface of the display panel DM that faces away from the display surface after the bending region BD has been bent so that the driving chip IC may face away from the display surface. The driving chip IC may be attached onto the display panel DM through an anisotropic conductive film or may be attached onto the display panel DM through ultrasonic bonding. A lateral width of the driving chip IC may be less than a lateral width of the display panel DM. The driving chip IC may be disposed at a central portion of the sub-region SR in a lateral direction, and edges of the driving chip IC may be respectively spaced from edges of the sub-region SR.

A pad portion PAD (or pads PAD) may be provided at an end of the sub-region SR of the display panel DM, and a printed circuit board FPC may be connected to the pad portion PAD. The printed circuit board (FPC) may be a flexible printed circuit board or a film.

A plurality of signal lines SL may be disposed in the sub-region SR, the bending region BD, and the main region MR. The signal lines SL may pass through the bending region BD from the sub-region SR and may extend to the main region MR. Some of the signal lines SL (for example, an initialization voltage line, a power line, and a control signal line) may not pass through the driving circuit IC and may extend from pads PAD to the main region MR. Some of the signal lines SL (for example, a data line DL) may pass through the driving circuit IC from pads PAD and the bending region and may extend to the main region MR. The signal lines SL passing through the driving circuit IC may have a fan-out structure in which the signal lines SL are relatively narrowly spaced in the sub-region SR and/or the bending region BD and are relatively widely spaced in the main region MR in order to cover the entirety of the main region MR wider than the driving chip IC. The signal lines SL not passing through the driving chip IC may pass along an outside of the signal lines SL passing through the driving chips IC.

The signal lines SL passing through the bending region BD may be bent as the panel is bent and thus may receive bending stress. The bending stress may cause a crack or a cutoff/discontinuation of the signal line SL. In order to minimize/prevent the crack or the cutoff, the signal lines SL passing through the bending region BD may be made of a substantially flexible material.

A first structure CP may be provided on the bending region BD. The first structure CP may prevent a crack (e.g., in a substrate) from being propagated to the signal lines SL. A section of the first structures CP may be substantially parallel to a curved portion of the bending region BD.

Figure 4:
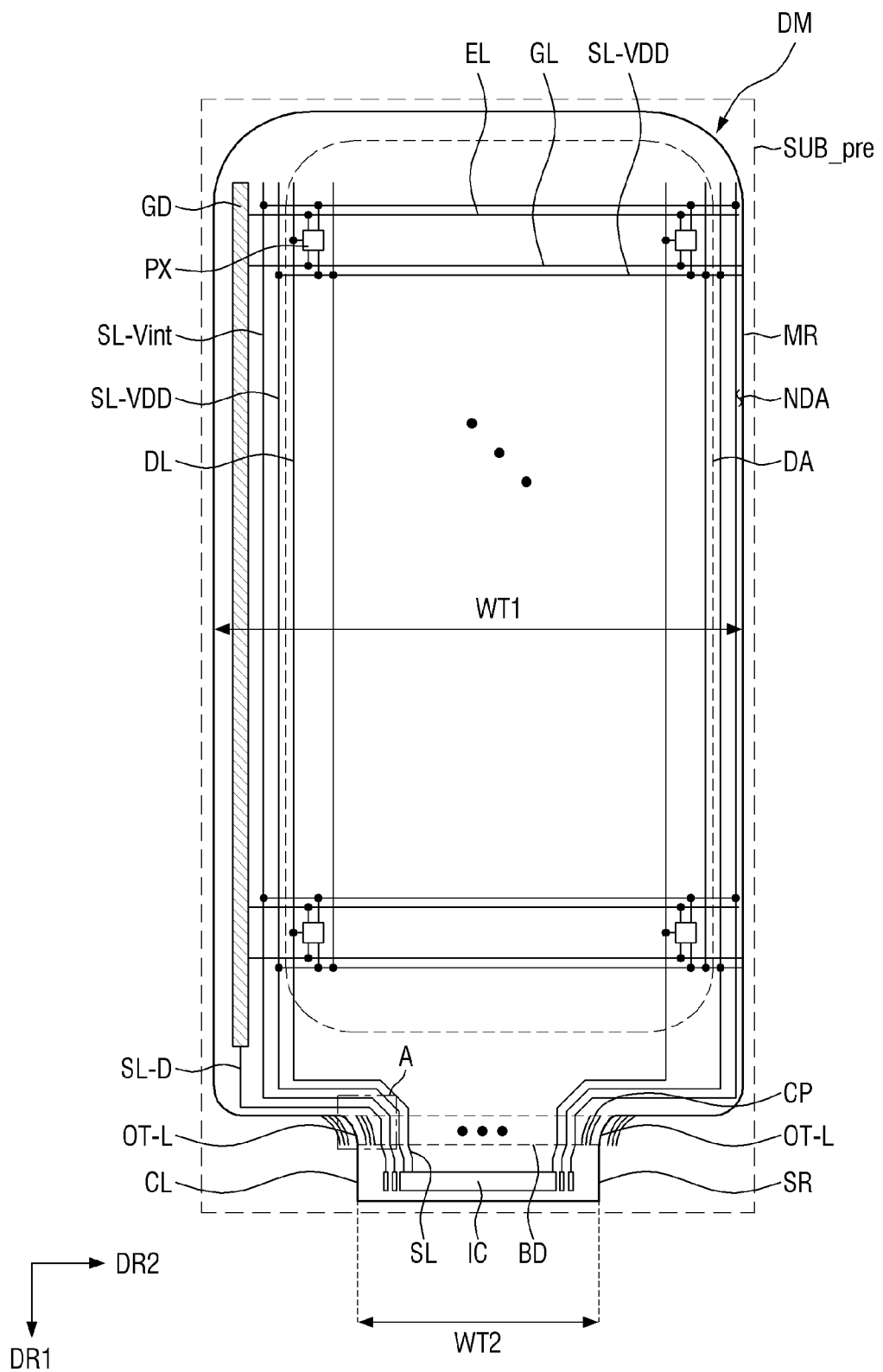
FIG. 4 is a plan/layout view illustrating signal lines in a display panel according to an embodiment.

FIG. 4 is a layout illustrating the signal lines SL in the display device DD according to an embodiment.

Referring to FIG. 4, the display device DD may include a main region MR, a bending region BD, and a sub-region SR. The main region MA may include a display region DA and a non-display region NDA in a plan view. The main region MR includes a plurality of pixels PX. A region in which the pixels PX are disposed is defined as the display region DA. The non-display region NDA may abut the display region DA.

The main region MR includes gate lines GL, data lines DL, emission lines EL, a control signal line SL-D, an initialization voltage line SL-Vint, and a voltage line SL-VDD. Each of the gate lines GL is connected to corresponding pixels PX of the plurality of pixels PX, and each of the data lines DL is connected to corresponding pixels PX of the plurality of pixels PX. Each of the emission lines EL may be parallel to a corresponding line of the gate lines GL. The control signal line SL-D may supply control signals to a gate driving circuit GD. The initialization voltage line SL-Vint may supply an initialization voltage to the plurality of pixels PX. The voltage line SL-VDD may be connected to the plurality of pixels PX and may supply a first voltage to the plurality of pixels PX. The voltage line SL-VDD may include a plurality of lines extending in a first direction DR1 and a plurality of lines extending in a second direction DR2.

The gate driving circuit GD, to which the gate lines GL and the emission lines EL are connected, may be disposed at one side of the non-display region NDA. Among the gate lines GL, the data lines DL, the emission lines EL, the control signal line SL-D, the initialization voltage line SL-Vint, and the voltage line SL-VDD, some may be disposed on the sample layer, and some may be disposed on different layers.

The bending region BD may include two outline lines OT-L, a plurality of lines SL, and a first structure CP. The two outline lines OT-L may be outlines which extend substantially in the first direction DR1 and connect the main region MR and the sub-region SR. The lines SL may connect lines of the main region MR and lines of the sub-region SR. A portion of the first structure CP may be disposed between each of the two outline lines OT-L and the plurality of lines SL.

FIG. 4 shows a configuration when the bending region BD and edges of the main region MR are not bent. In this configuration, the main region MR, the bending region BD, and the sub-region SR may be sequentially disposed in the first direction DR1. A width WT1 of the main region MR in the second direction DR2 may be greater than a width WT2 of the bending region BD in the second direction DR2.

Before cutting, an original substrate SUB_pre shown by a dotted line in FIG. 4 may have a rectangular shape. In order to form the display device DD of which four corners are rounded and a connection portion between the main region MR and the bending region BD has an "L" shape, the original substrate SUB_pre may be cut along a cutting line CL using a laser LS (illustrated in FIG. 15). The cutting line CL may be cut through a laser cutting method or the like. The first structure CP may prevent the signal line SL from being damaged by a crack generated when the cutting line CL is cut by laser cutting or the like.

Figure 5:
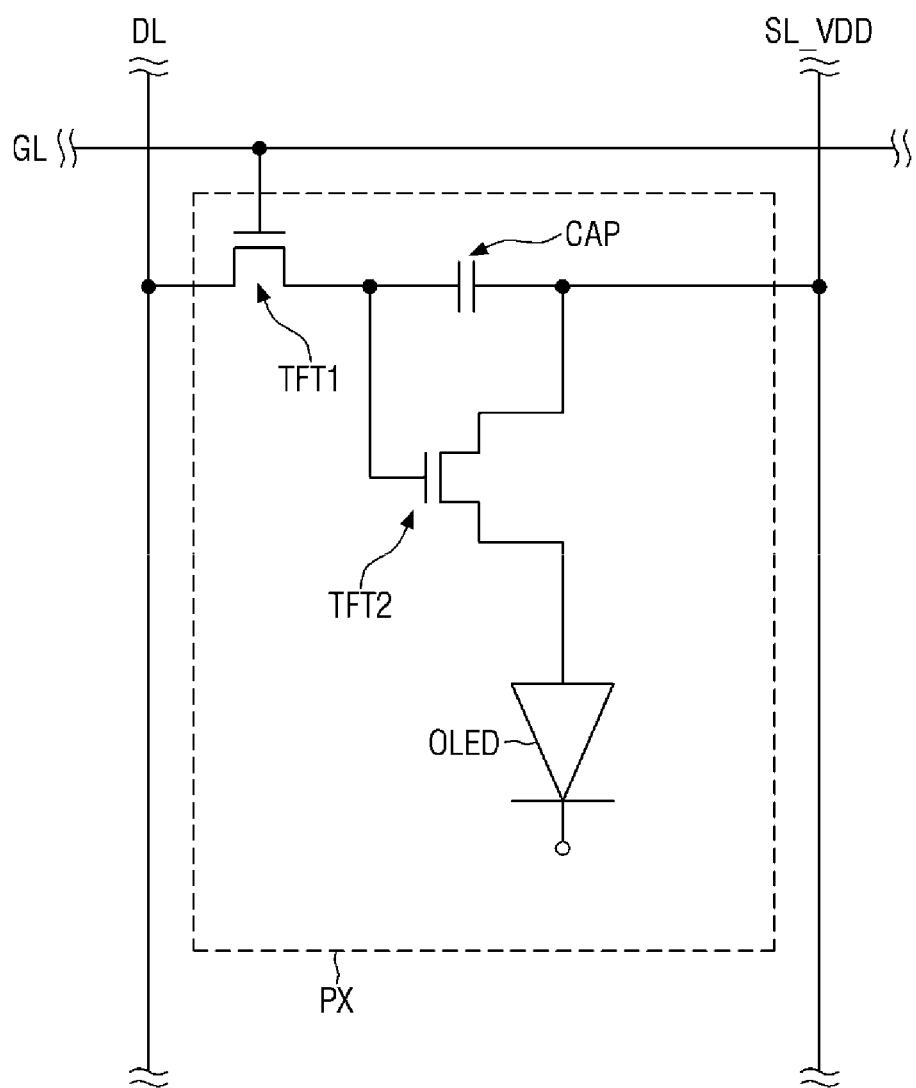
FIG. 5 is an equivalent circuit diagram illustrating a pixel according to an embodiment.

FIG. 5 is an equivalent circuit diagram illustrating a pixel PX according to an embodiment.

FIG. 5 shows the pixel PX connected to at least one gate line GL, at least one data line DL, and a voltage line SL-VDD.

The pixel PX includes an organic light-emitting diode OLED as a display element. The organic light-emitting diode OLED may be a top emission type diode or a bottom emission type diode. The pixel PX may include a first transistor TFT1 (or a switching transistor), a second transistor TFT2 (or a driving transistor), and a capacitor CAP as a circuit unit configured to drive the organic light-emitting diode OLED.

The first transistor TFT1 outputs a data signal applied to the data line DL in response to a scan signal applied to the gate line GL. The capacitor CAP is charged with a voltage corresponding to the data signal received from the first transistor TFT1.

The second transistor TFT2 is connected to the organic light-emitting diode OLED. The second transistor TFT2 controls a driving current flowing in the organic light-emitting diode OLED in response to a quantity of electric charges stored in the capacitor CAP. The organic light-emitting diode OLED emits light during a turn-on period of the second transistor TFT2.

Figure 6:
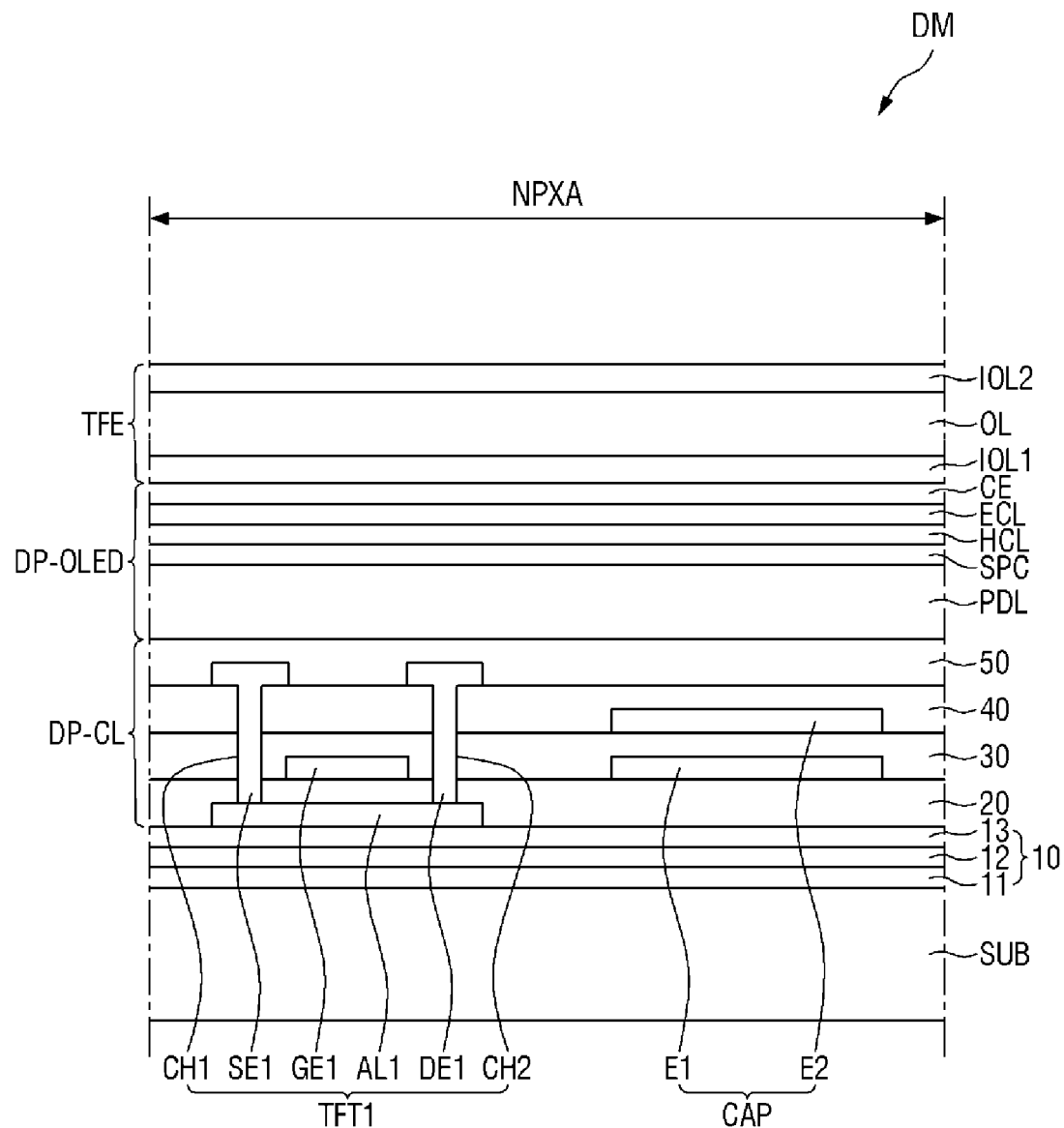
FIG. 6 is a partial cross-sectional view illustrating a display module according to an embodiment.
Figure 7:
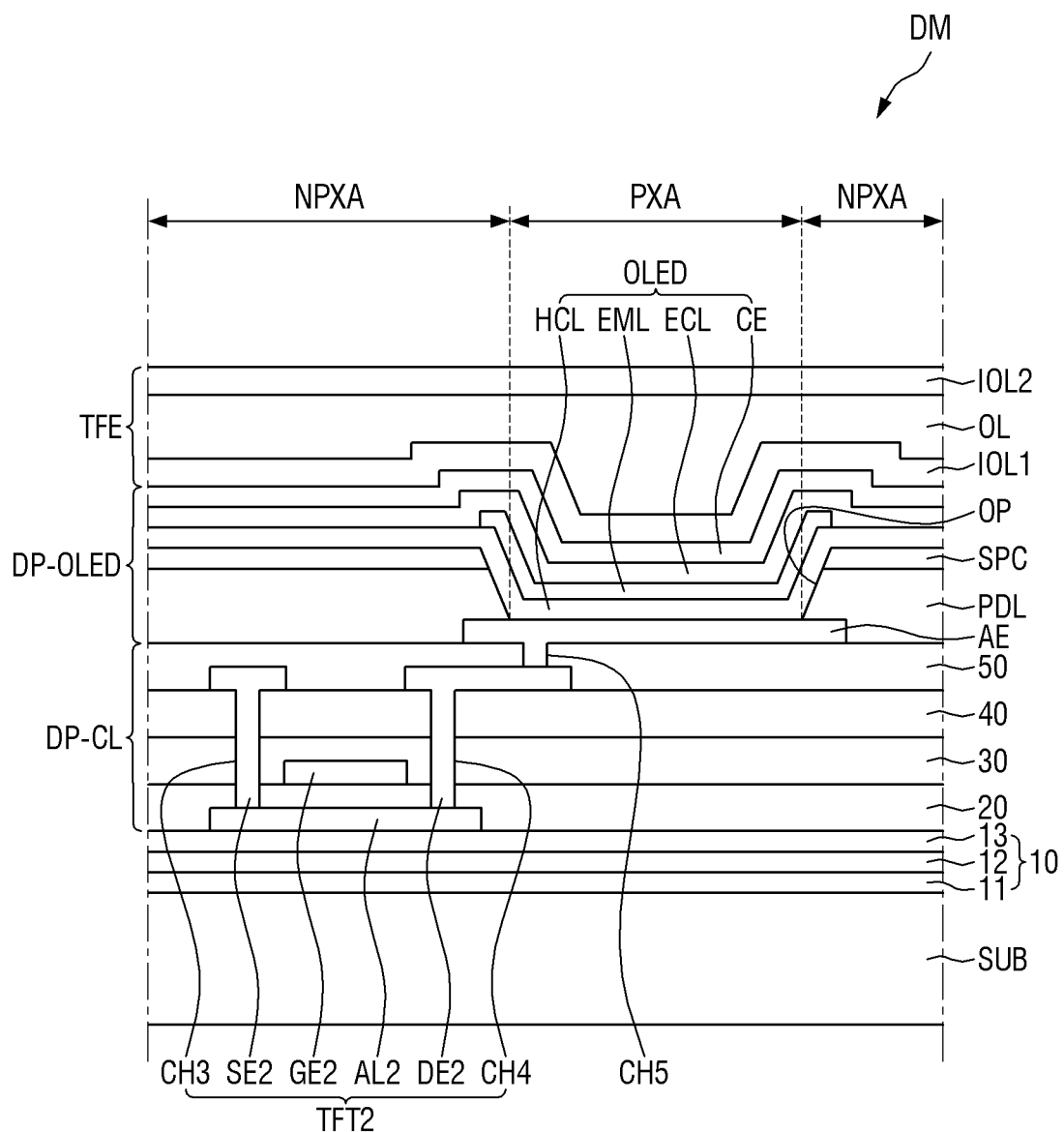
FIG. 7 is a partial cross-sectional view illustrating a display module according to an embodiment.

FIGS. 6 and 7 are partial cross-sectional views illustrating a display module DM according to an embodiment.

FIG. 6 shows a cross section of a portion corresponding to the first transistor TFT1 and the capacitor CAP of the equivalent circuit shown in FIG. 5. FIG. 7 shows a cross section of a portion corresponding to the second transistor TFT2 and the organic light-emitting diode OLED of the equivalent circuit shown in FIG. 5.

As shown in FIGS. 6 and 7, a barrier layer 10 is disposed on a substrate SUB. The barrier layer 10 may include first, second, and third layers 11, 12, and 13. The first to third layers 11 to 13 may be made of an inorganic material. An inorganic layer may include at least one of silicon nitride, silicon oxynitride, silicon oxide, titanium oxide, and aluminum oxide. The barrier layer 10 may be optional, may also include an organic layer, or may also include two or more layers. The organic layer may include a polymer, for example, an acrylic-based organic layer.

A circuit layer DP-CL is disposed on the barrier layer 10. A semiconductor pattern AL1 (hereinafter referred to as a first semiconductor pattern) of the first transistor TFT1 and a semiconductor pattern AL2 (hereinafter referred to as a second semiconductor pattern) of the second transistor TFT2 are disposed on the barrier layer 10. The first semiconductor pattern AL1 and the second semiconductor pattern AL2 may include at least one of amorphous silicon, polysilicon, and a metal oxide semiconductor.

A first insulating layer 20 is disposed on the substrate SUB to cover the first semiconductor pattern AL1 and the second semiconductor pattern AL2. The first insulating layer 20 includes an organic layer and/or an inorganic layer. In particular, the first insulating layer 20 may include an inorganic thin film. The inorganic thin film may include at least one of silicon nitride, silicon oxynitride, silicon oxide, titanium oxide, and aluminum oxide.

A control electrode GE1 (hereinafter referred to as a first control electrode) of the first transistor TFT1, a control electrode GE2 (hereinafter referred to as a second control electrode) of the second transistor TFT2, and a control electrode E1 may be disposed on the first insulating layer 20. The first control electrode GE1, the second control electrode GE2, and the first electrode E1 may be formed through the same photolithography process as the gate lines GL (see FIG. 4). In other words, the first electrode E1 may be made of the same material, have the same stacking structure, and be disposed on the same layer as the gate lines GL.

A second insulating layer 30 is disposed on the first insulating layer 20 to cover the first control electrode GE1, the second control electrode GE2, and the first electrode E1. The second insulating layer 30 includes an organic layer and/or an inorganic layer. In particular, the second insulating layer 30 may include an inorganic thin film. The inorganic film may include at least one of silicon nitride, silicon oxynitride, silicon oxide, titanium oxide, and aluminum oxide. A second electrode E2 may be disposed on the second insulating layer 30. A third insulating layer 40 is disposed on the second insulating layer 30 to cover the second electrode E2. The third insulating layer 40 includes an organic layer and/or an inorganic layer. In particular, the third insulating layer 40 may include an inorganic thin film. The inorganic film may include at least one of silicon nitride, silicon oxynitride, silicon oxide, titanium oxide, and aluminum oxide.

The data lines DL (see FIG. 4) may be disposed on the third insulating layer 40. An input electrode SE1 (hereinafter, referred to as a first input electrode) and an output electrode DE1 (hereinafter, referred to as a first output electrode) of the first transistor TFT1 may be disposed on the third insulating layer 40. An input electrode SE2 (hereinafter, referred to as a second input electrode) and an output electrode DE2 (hereinafter, referred to as a second output electrode) of the second transistor TFT2 may be disposed on the third insulating layer 40. A first input electrode SE1 is branched from a corresponding line of the data lines DL. As an example, the second electrode E2 illustrated in FIG. 6 is disposed between the second insulating layer 30 and the third insulating layer 40. The electrode E2 of the capacitor CAP may be disposed on the third insulating layer 40. The second electrode E2 may be formed through the same photolithography process, be made of the same material, and have the same stacking structure as the data lines DL and the power line PL.

The first input electrode SE1 and a first output electrode DE1 are electrically connected to the first semiconductor pattern AL1 through a first through-hole CH1 and a second through-hole CH2 passing through the first, second, third insulating layers 20, 30, and 40. The first output electrode DE1 may be electrically connected to the first electrode E1. For example, the first output electrode DE1 may be connected to the first electrode E1 through a through-hole (not shown) passing through the second insulating layer 30 and the third insulating layer 40. A second input electrode SE2 and a second output electrode DE2 are electrically connected to the second semiconductor pattern AL2 through a third through-hole CH3 and a fourth through-hole CH4 passing through the first, second, third insulating layers 20, 30, and 40. In embodiments, the first transistor TFT1 and the second transistor TFT2 may have a bottom gate structure.

A fourth insulating layer 50 is formed on the third insulating layer 40 to cover the first input electrode SE1, the first output electrode DE1, the second input electrode SE2, and the second output electrode DE2. The fourth insulating layer 50 includes an organic layer and/or an inorganic layer. In particular, the fourth insulating layer 50 may include an organic material to provide a flat surface. The organic material may include a polymer, and for example, the fourth insulating layer 50 may include an acrylic based organic layer.

At least one of the first, second, third, and fourth insulating layers 20, 30, 40, and 50 may be optional according to a circuit structure of the pixel. Each of the first, second, and third insulating layers 20, 30, and 40 may be defined as an interlayer insulating layer. The interlayer insulating layer is interposed between a conductive pattern disposed below the interlayer insulating layer and a conductive pattern disposed on the interlayer insulating layer to insulate the conductive patterns from each other.

A light-emitting element layer DP-OLED is disposed on the fourth insulating layer 50. A pixel definition layer PDL, a spacer SPC, and an organic light-emitting diode OLED are disposed on the fourth insulating layer 50.

An anode AE is disposed on the fourth insulating layer 50. The anode AE is connected to the second output electrode DE2 through a fifth through-hole CH5 passing through the fourth insulating layer 50. An opening OP is defined in the pixel definition layer PDL and the spacer SPC. The opening OP exposes at least a portion of the anode AE. The pixel definition layer PDL and the spacer SPC include an organic layer and/or an inorganic layer. In particular, the pixel definition layer PDL and the spacer SPC may include an organic material to provide a flat surface. The organic material may include a polymer, and for example, the pixel definition layer PDL and the spacer SPC may include an acrylic based organic layer.

The spacer SPC may be disposed on the pixel definition layer PDL to support a mask used when the organic light-emitting diode OLED or the like is formed. The spacer SPC may substantially cover a face of the pixel definition layer PDL. The spacer SPC may be formed only on a partial region of the pixel definition layer PDL or may be optional.

The light-emitting element layer DP-OLED includes an emission region PXA and a non-emission NPXA adjacent to the emission region PXA. The non-emission region NPXA may surround the emission region PXA. The emission region PXA may be defined to correspond to a partial region of the anode AE which is exposed by the opening OP.

A hole control layer HCL may be commonly disposed in the emission region PXA and the non-emission region NPXA. Although not separately shown, a common layer such as the hole control layer HCL may be commonly formed in the plurality of pixels PX (see FIG. 4).

An organic light-emitting layer EML is disposed on the hole control layer HCL. The organic light-emitting layer EML may be disposed only in a region corresponding to the opening OP. That is, the organic light-emitting layer (EML) may be formed separately for each of the plurality of pixels PX.

An electron control layer ECL is disposed on the organic light-emitting layer EML. A cathode CE is disposed on the electron control layer ECL. The cathode CE is commonly disposed in the plurality of pixels PX.

The example of the patterned organic light-emitting layer EML is illustrated in the present embodiment, but the organic light-emitting layer EML may be commonly disposed in the plurality of pixels PX. In this case, the organic light-emitting layer EML may generate white light. Furthermore, the organic light-emitting layer EML may have a multi-layered structure.

In the present embodiment, a thin film encapsulation layer TFE directly covers the cathode CE. In the present embodiment, a capping layer may be further disposed to cover the cathode CE. Here, the thin film encapsulation layer TFE directly covers the capping layer. The thin film encapsulation layer TFE may include a plurality of inorganic thin films IOL1 and IOL2 and an organic thin film OL.

Figure 8:
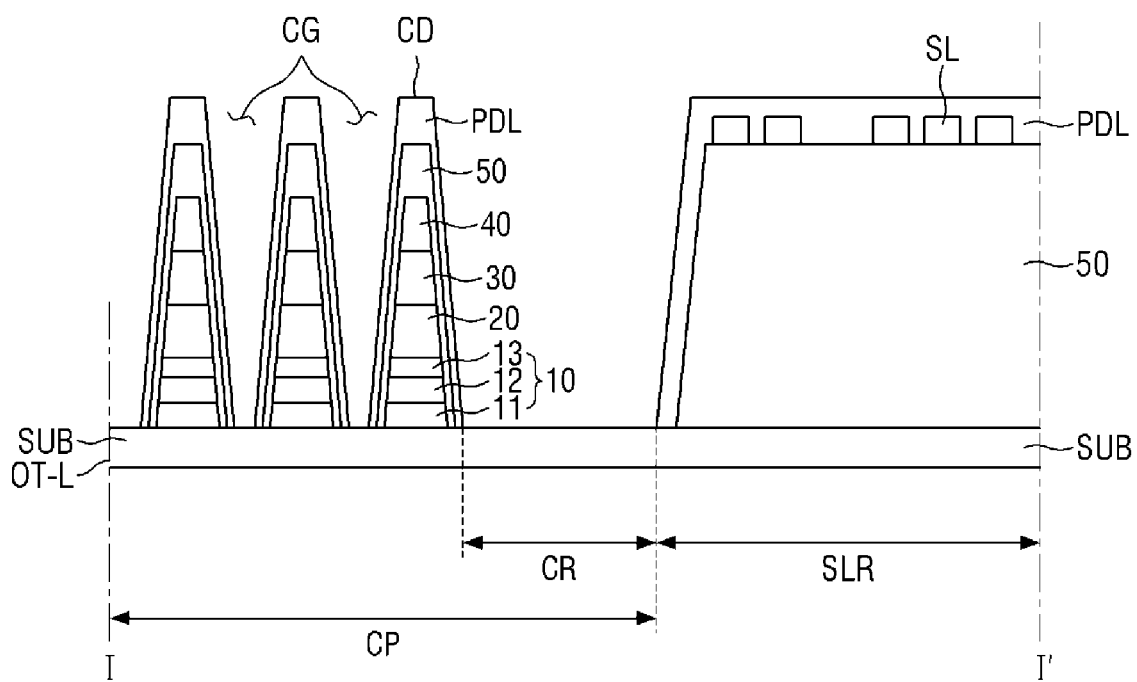
FIG. 8 is a cross-sectional view taken along a line I-I' shown in FIG. 3 according to an embodiment.

FIG. 8 is a cross-sectional view taken along a line I-I' shown in FIG. 3. Referring to FIGS. 6, 7, and 8, the bending region BD may include the first structure CP and a signal line region SLR. The first structure CP may include a plurality of dams CD, at least one groove CG formed between the dams CD, and a region/gap CR.

The first layer 11, the second layer 12, the third layer 13, the first insulating layer 20, the second insulating layer 30, and the third insulating layer 40, which include an inorganic material, may not be disposed in the region CR and the signal line region SLR. Therefore, it is possible to reduce stress applied to the bending region BD.

The plurality of dams CD may at least one of the first layer 11, the second layer 12, the third layer 13, the first insulating layer 20, the second insulating layer 30, and the third insulating layer 40 and may be disposed in a partial region of the first structure CP. The first layer 11, the second layer 12, the third layer 13, the first insulating layer 20, the second insulating layer 30, and the third insulating layer 40 may be inorganic layers. At least one of the fourth insulating layer 50 and the pixel definition layer PDL may be further provided on at least one of the first layer 11, the second layer 12, the third layer 13, the first insulating layer 20, the second insulating layer 30, and the third insulating layer 40. The fourth insulating layer 50 and the pixel definition layer PDL may be organic layers. At least one groove CG may be formed between the dams CD. The substrate SUB may be exposed at the groove CG.

A first structure CP may be disposed between an outline lines OT-L and the lines SL. The plurality of dams CD may be formed through the same photolithography process as the barrier layer 10 and the circuit layer DP-CL. The plurality of dams CD may be made of the same materials and have the same stacking structure as the barrier layer 10 and the circuit layer DP-CL. The plurality of dams CD may be formed concurrently in a process of forming the third through-hole CH3 and the fourth through-hole CH4 (illustrated in FIG. 7).

The fourth insulating layer 50 (a planarizing film) may be disposed on the inorganic layer(s) of the plurality of dams CD. Upper surfaces of the inorganic layer(s) may be completely covered by the fourth insulating layer 50. The plurality of dams CD including an organic layer may be formed concurrently in a process of forming the fifth through-hole CH5 (illustrated in FIG. 7). The fourth insulating layer 50 may be disposed at the signal line region SR of the bending region BD, and the signal lines SL may be disposed on the fourth insulating layer 50. The signal lines SL disposed on the fourth insulating layer 50 may be coplanar with the signal lines SL disposed on the main region MR and the sub-region SR. The signal lines SL may not be disposed on the first layer 11, the second layer 12, the third layer 13, the first insulating layer 20, the second insulating layer 30, and the third insulating layer 40.

An organic layer for forming the pixel definition layer PDL may be disposed on the fourth insulating layer 50. Upper surfaces of the fourth insulating layer 50 may be completely covered by the organic layer. The plurality of dams CD including the organic layer may be formed concurrently in a process of forming the opening OP of the light-emitting region PXA (illustrated in FIG. 7). The organic layer forming the pixel definition layer PDL may be disposed on the signal lines SL disposed on the fourth insulating layer 50. As a result, the signal line SL may be prevented from being exposed.

When the outline OT-L is formed through a laser cutting process, a crack may be generated in the main region MR, the bending region BD, and/or the sub-region SR. Since the bending region BD is bent, the generated crack may continuously grow and may propagate. The dams CD and at least one groove CG disposed between the dams may be substantially parallel to the outline OT-L, for preventing the generated crack from propagating to the signal lines SL. Advantageously, it is possible to reduce defects caused by stress applied to the bending region BD and improve reliability and manufacturing yield of display devices.

Figure 9:
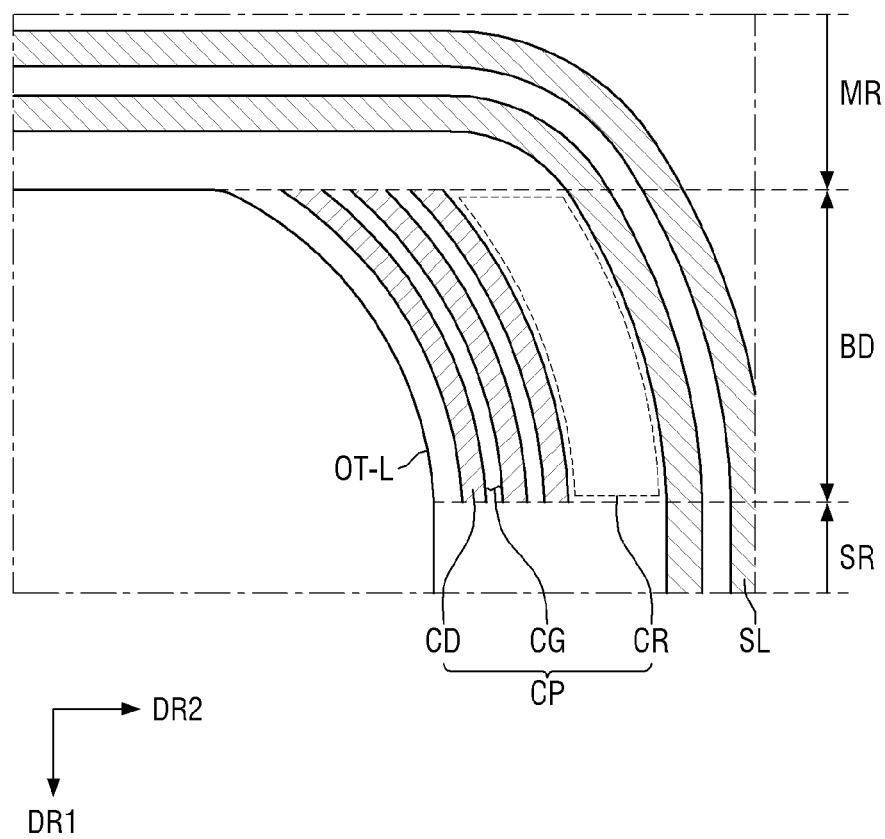
FIG. 9 is an enlarged plan view illustrating a region A shown in FIG. 4 according to an embodiment.

FIG. 9 is an enlarged plan view illustrating the region A shown in FIG. 4.

Referring to FIG. 9, the first structure CP may be disposed between the line SL and an outline OT-L in a plan view of the bending region BD when the bending region is in a flat configuration. The first structure CP may be spaced apart from the outline OT-L. The crack mitigation structure may prevent a crack, which may be generated in a process of forming the outline OT-L, from propagating to the signal lines SL. At least one of the two outlines OT-L may include a curved portion. For example, a distance between the two outlines OT-L of the bending region BD may be gradually decreased from the main region MR to the sub-region SR. The first structure CP may include a dam CD and a groove CG, which extend along (and substantially parallel to) the curved outline OTL. The groove CG may be disposed between dams CD in the second direction DR2 different from the first direction DR1. Since the first structure CP includes the slit-shaped dam CD and the groove CG, even if a crack is generated in a portion of the first structure CP, the crack may be prevented from propagating.

As an example, the first structure CP illustrated in FIG. 9 includes three dams CD and two grooves CG. The first structure CP may further include a region/spacing/gap CR between the dam CD and the signal line SL. In the region CR, the organic layer such as the first layer 11, the second layer 12, the third layer 13, the first insulating layer 20, the second insulating layer 30, and the third insulating layer 40 may be removed to expose the substrate SUB.

Figure 10:
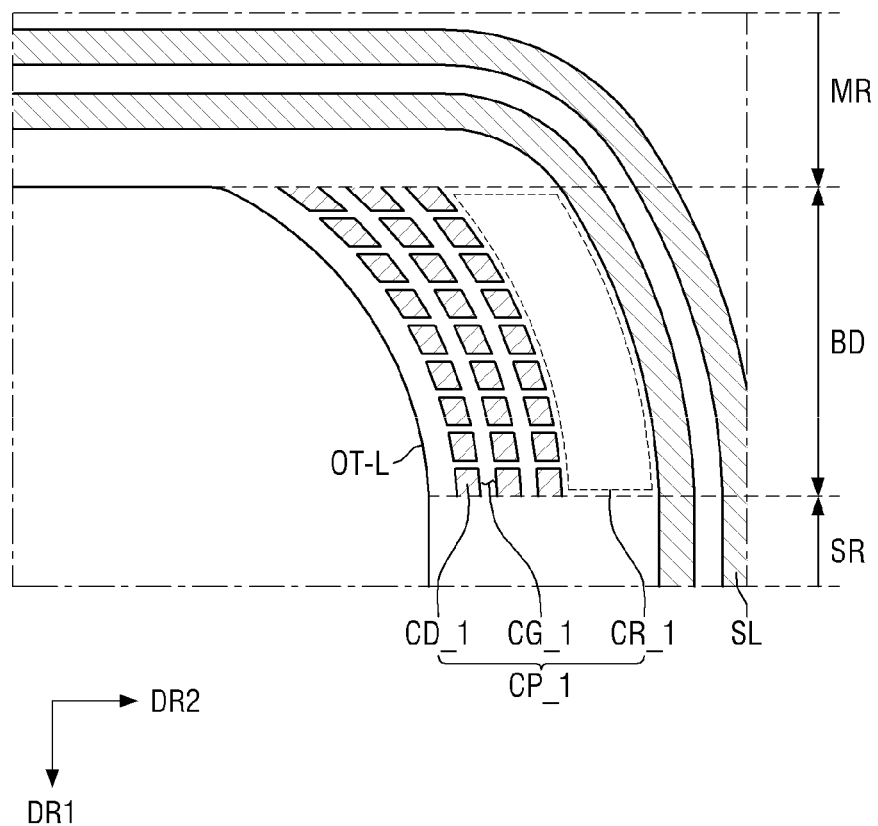
FIG. 10 is an enlarged plan view illustrating the region A shown in FIG. 4 according to an embodiment.

FIG. 10 is an enlarged plan view illustrating the region A shown in FIG. 4 according to an embodiment.

Referring to FIG. 10, a first structure CP_1 may be disposed between a line SL and an outline OT-L in a plan view of the bending region BD.

The first structure CP_1 may include a plurality of dams CD_1, and the plurality of dams CD_1 may be disposed along curved sections of an outline OTL. The dams CD_1 may have island shapes. A plurality of grooves CG_1 may be disposed along a first direction DR1 and a second direction DR2. The plurality of dams CD_1 may be spaced along the outline OT-L. The first structure CP_1 may include a gap CR_1 between the dams CD_1 and the signal lines SL.

In comparison with FIG. 9, the dams CD_1 of FIG. 10 may further reduce stress generated when the bending region BD is bent.

Figure 11:
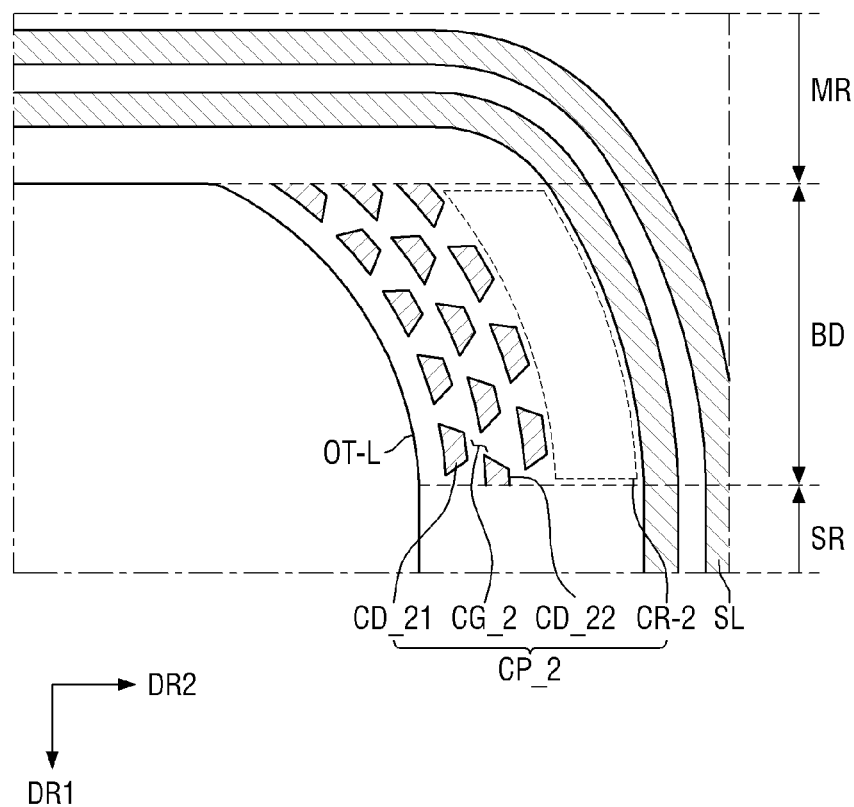
FIG. 11 is an enlarged plan view illustrating the region A shown in FIG. 4 according to an embodiment.

FIG. 11 is an enlarged plan view illustrating the region A shown in FIG. 4 according to an embodiment.

Referring to FIG. 11, a first structure CP_2 may be disposed between a line SL and an outline OT-L in a plan view of the bending region BD. The first structures CP_2 may be disposed along curved sections of the outline OTL. The first structure CP_2 may include first dams CD_21 distributed substantially in the first direction DR1 and second dams CD_22 spaced apart from the first dams CD_21 in the second direction DR2 and distributed substantially in the first direction DR1. The first structure CP_2 may include a gap CR_2 between the second dams CD_22 and the signal lines SL. The first structure CP_2 may include gaps CG_2 between the dams CD_21 and CD_22.

The first dam CD_21 and the second dam CD_22 may have trapezoidal shapes in a plan view.

The first dam CD_21 and the second dam CD_22 may be alternately disposed in the second direction DR2. That is, the first dam CD_21 and the second dam CD_22 may be disposed in a zigzag pattern in the first direction DR1. A second dam CD_22 may overlap (two neighboring ends of) two immediately neighboring first dams CD_21. Therefore, it is possible to further reduce stress generated when the bending region BD is bent. In addition, a crack passing between adjacent two first dams CD_21 in the first direction DR1 may be prevented from propagating to the lines SL by the second dams CD_22 adjacent in the second direction DR2.

Figure 12:
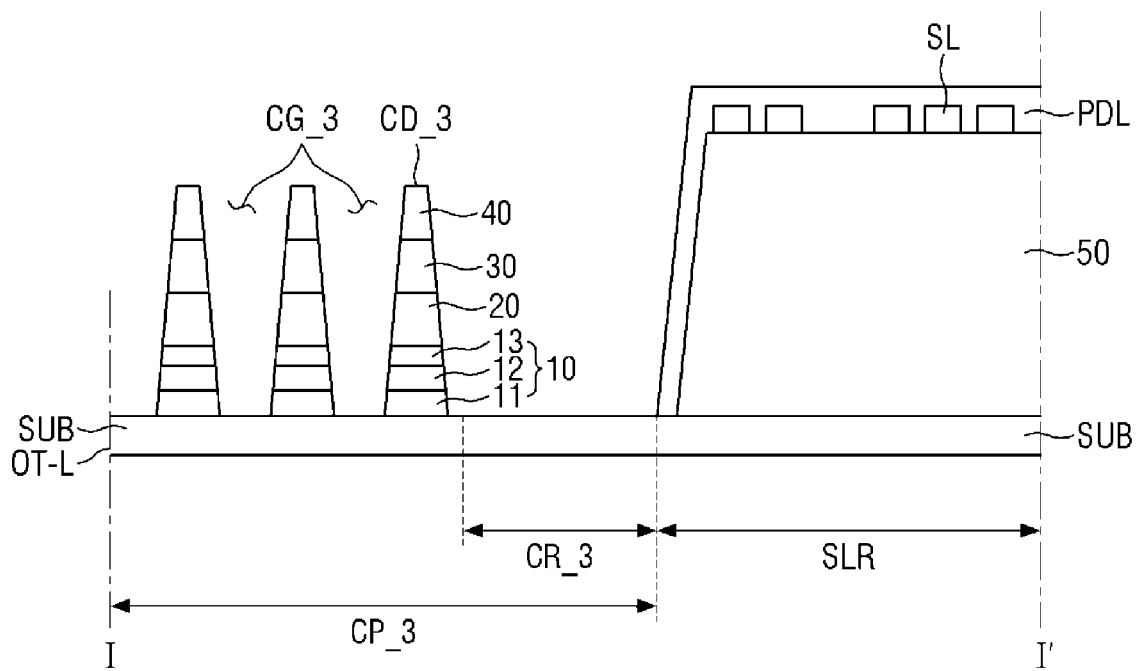
FIG. 12 is a cross-sectional view taken along the line I-I' shown in FIG. 3 according to an embodiment.

FIG. 12 is a cross-sectional view taken along the line I-I' shown in FIG. 3 according to an embodiment. Referring to FIGS. 6, 7, and 12, a plurality of dams CD_3 include a first layer 11, a second layer 12, a third layer 13, a first insulating layer 20, and a second insulating layer 30, and a third insulating layer 40, which include an inorganic material.

The bending region BD may include a first structure CP_3 and a signal line region SLR. The first structure CP_3 may include dams CD_3, grooves CG_3 formed between the dams CD_3, and a region/gap CR_3.

The first layer 11, the second layer 12, the third layer 13, the first insulating layer 20, the second insulating layer 30, and the third insulating layer 40, which include one or more inorganic materials, may not be disposed in the region CR_3 and the signal line region SLR. Therefore, it is possible to reduce stress applied to the bending region BD bent toward a rear surface of the main region MR.

The plurality of dams CD_3 may be disposed in a partial region of the first structure CP_3. The first layer 11, the second layer 12, the third layer 13, the first insulating layer 20, the second insulating layer 30, and the third insulating layer 40 may be inorganic layers. A substrate SUB may be exposed at the grooves CG_3. A first structure CP_3 may be disposed between each outline OT-L and the signal lines SL. The plurality of dams CD_3 may be formed through the same photolithography process as the barrier layer 10 and the circuit layer DP-CL. The plurality of dams CD_3 may be made of the same materials and have the same stacking structure as the barrier layer 10 and the circuit layer DP-CL. The plurality of dams CD_3 may be formed concurrently in a process of forming the third through-hole CH3 and the fourth through-hole CH4 (illustrated in FIG. 7).

Figure 13:
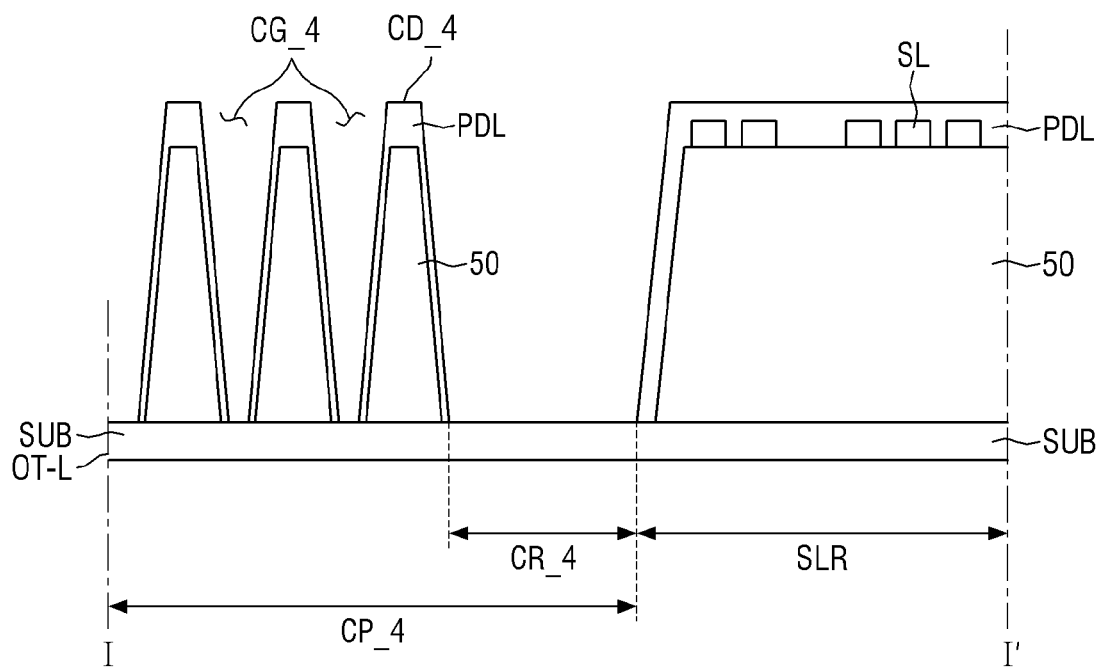
FIG. 13 is a cross-sectional view taken along the line I-I' shown in FIG. 3 according to an embodiment.

FIG. 13 is a cross-sectional view taken along the line I-I' shown in FIG. 3 according to an embodiment.

Referring to FIGS. 6, 7, and 13, a plurality of damps CD_4 include a fourth insulating layer 50 and a pixel definition layer PDL, which include an organic material.

The bending region BD may include a first structure CP_4 and a signal line region SLR. The first structure CP_4 may include dams CD_4, grooves CG_4 formed between the plurality of dams CD_4, and a region/gap CR_4.

No inorganic material may be disposed in the region CR_4 and the signal line region SLR. No inorganic layer may be included in the bending region BD. Therefore, it is possible to reduce stress applied to the bending region BD.

The plurality of dams CD_4 may be disposed in a partial region of the first structure CP_4. The fourth insulating layer 50 and the pixel definition layer PDL may be organic layers. A substrate SUB may be exposed at the grooves CG_4.

A plurality of first structure CP_4 may be disposed between each of two outline lines OT-L and the signal lines SL. All of the first layer 11, the second layer 12, the third layer 13, the first insulating layer 20, the second insulating layer 30, and the third insulating layer 40 may be removed from the bending region BD in a process of forming the third through-hole CH3 and the fourth through-hole CH4 (illustrated in FIG. 7).

The fourth insulating layer 50 may be disposed on the substrate SUB. The plurality of dams CD_4 may be formed concurrently in a process of forming the fifth through-hole CH5 (illustrated in FIG. 7). The fourth insulating layer 50 may be disposed at the signal line region SLR of the bending region BD, and the signal lines SL may be disposed on the fourth insulating layer 50. As a result, the signal lines SL disposed on the fourth insulating layer 50 may be coplanar with the lines SL disposed on the main region MR and the sub-region SR.

An organic layer for forming the pixel definition layer PDL may be disposed on the fourth insulating layer 50 at the plurality of damps CD_4 and at the signal line region SLR. Upper surfaces of the fourth insulating layer 50 may be completely covered by the organic layer. The plurality of dams CD_4 including the organic layer may be formed concurrently in a process of forming the opening OP of the light-emitting region PXA (illustrated in FIG. 7). The organic layer forming the pixel definition layer PDL may be disposed on the signal lines SL disposed on the fourth insulating layer 50. As a result, the signal lines SL may be prevented from being exposed.

Figure 14:
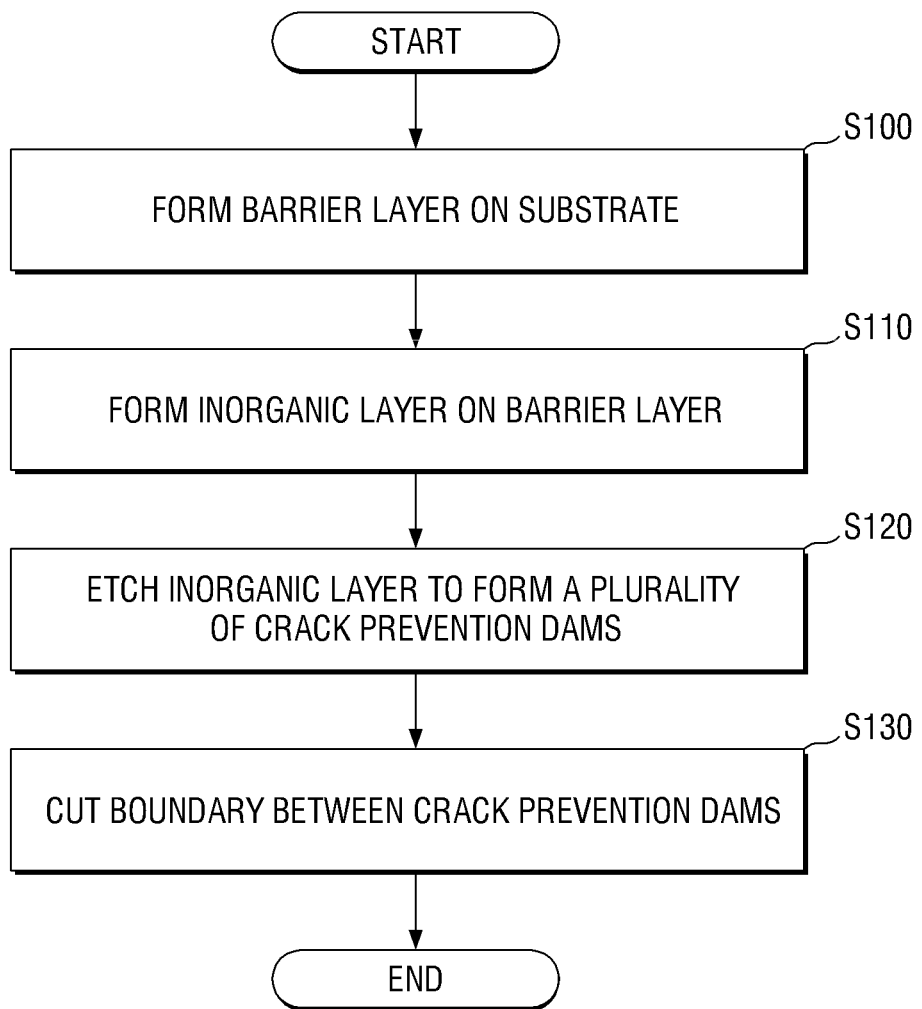
FIG. 14 is a flowchart illustrating a method for manufacturing a display device according to an embodiment.

FIG. 14 is a flowchart of a method for manufacturing a display device according to an embodiment. FIG. 15 is a cross-sectional view illustrating a main region and a bending region according to an embodiment.

Referring to FIGS. 4, 14 and 15, the method may include forming at least one barrier layer 10 on an original substrate SUB_pre (S100).

Before cutting, the original substrate SUB_pre (shown by a dotted line in FIG. 4) may have a rectangular shape. The barrier layer 10 may be disposed on an entire face of the original substrate SUB_pre. The barrier layer 10 may include first, second, and third layers 11, 12, and 13. The layers 11, 12, and 13 may be made of one or more inorganic materials. An inorganic layer may include at least one of silicon nitride, silicon oxynitride, silicon oxide, titanium oxide, and aluminum oxide.

The method may include forming at least one inorganic layer on the barrier layer (S110).

A semiconductor pattern AL2 is disposed on the barrier layer 10 of the display region DA. The semiconductor pattern AL2 may include at least one of amorphous silicon, polysilicon, and a metal oxide semiconductor. A first insulating layer 20 may be disposed on the semiconductor pattern AL2. A control electrode GE2 of a second transistor TFT2 may be disposed on the first insulating layer 20. The control electrode GE2 may be made of the same material as gate lines GL. A second insulating layer 30 and a third insulating layer 40 may be sequentially disposed on the control electrode GE2. The insulating layers 20, 30, and 40 may include an inorganic layer. The inorganic layer may include at least one of silicon nitride, silicon oxynitride, silicon oxide, titanium oxide, and aluminum oxide. The first insulating layer 20, the second insulating layer 30, and the third insulating layer 40 may be sequentially stacked on the bending region BD.

The method may include forming dams CD by etching at least the barrier layer 10 and the above-described inorganic layers in the bending region BD (S120).

According to an embodiment, the dams CD and grooves CG may be formed concurrently in a process of forming a third through-hole CH3 and a fourth through-hole CH4 (illustrated in FIG. 7).

The forming of the dams CD (S120) may further include applying a planarizing film (for example, the fourth insulating layer 50) and etching the planarizing film at locations between remaining portions of the layers 10, 20, 30, 40, and 50 in the bending region BD.

The fourth insulating layer 50 may be disposed on the inorganic layers of the dams CD. Upper surfaces of the inorganic layer may be completely/substantially covered by the fourth insulating layer 50.

The dams CD (including an organic layer, i.e., the fourth insulating layer 50) and the grooves CG may be formed concurrently in a process of forming a fifth through-hole CH5 (illustrated in FIG. 7). The fourth insulating layer 50 may also be disposed on a signal line region SLR of the bending region BD, and signal lines SL may be disposed on the fourth insulating layer 50.

The forming of the dams CD (S120) may further include applying a pixel definition layer PDL on remaining portions of the planarizing film 50 and etching the pixel definition layer PDL at locations between the remaining portions of the planarizing film 50 in the bending region BD.

An organic layer for forming the pixel definition layer PDL may be disposed on the remaining portions of the fourth insulating layer 50 (i.e., the planarizing film 50). Upper surfaces of the remaining portions of the fourth insulating layer 50 may be completely/substantially covered by the organic layer.

The plurality of dams CD (including the organic layer forming the pixel definition layer PDL) may be formed concurrently in a process of forming an opening OP of a light-emitting region PXA (illustrated in FIG. 7). The organic layer forming the pixel definition layer PDL cover the signal lines SL disposed on the fourth insulating layer 50.

The method may include cutting the original substrate SUB_pre at a location between two dams CD with (a laser beam provided by) a laser LS to form an outline OT-L of the bending region BD (S130).

In order to form a display device DD of which four corners are rounded and a connection portion between the main region MR and the bending region BD has a "L" shape, the original substrate SUB_pre may be cut along a cutting line CL using the laser LS. The cutting line CL may be cut through a laser cutting method or the like. A green/$CO_2$ laser may be used as the laser.

Grooves CG and dams CD may be formed at opposite sides of the cutting line CL. Therefore, it is possible to also prevent a crack from propagating toward/through a to-be- removed portion of the original substrate SUB_pre. Advantageously, the first structure CP may prevent signal lines SL from being damaged by a crack that is generated when the cutting line CL is cut by laser cutting or the like.

Many variations and modifications can be made to the described example embodiments without substantially departing from the scope defined in the claims.

What is claimed is:

1. A method for manufacturing a display device, the method comprising:
   forming an insulating layer on a substrate, wherein the substrate comprises a main region and a neighboring region, wherein the neighboring region is directly connected to the main region, wherein the insulating layer comprises a first insulating section and a second insulating section, wherein the first insulating section overlaps the main region, and wherein the second insulating section overlaps the neighboring region;
   forming transistors that overlap the first insulating section;
   etching at least the second insulating section to form dams, wherein each of the dams comprises a portion of the second insulating section; and
   cutting the neighboring region at a location between two of the dams to form a bending region, wherein the bending region comprises a curved outline section, wherein remaining dams of the dams on the bending region are substantially parallel to the curved outline section.

2. The method of claim 1, further comprising:
   forming an insulating film on the portions of the second insulating section; and
   etching the insulating film at locations between the portions of the second insulating section.

3. A method for manufacturing a display device, the method comprising:
   forming an insulating layer on a substrate, wherein the substrate comprises a main region and a neighboring region, wherein the neighboring region is directly connected to the main region, wherein the insulating layer comprises a first insulating section and a second insulating section, wherein the first insulating section overlaps the main region, and wherein the second insulating section overlaps the neighboring region;
   forming transistors that overlap the first insulating section;
   etching at least the second insulating section to form dams, wherein each of the dams comprises a portion of the second insulating section;
   cutting the neighboring region at a location between two of the dams to form a bending region, wherein the bending region comprises a curved outline section;
   forming an insulating film on the portions of the second insulating section;
   etching the insulating film at locations between the portions of the second insulating section;
   forming a pixel definition layer on remaining portions of the insulating film on the portions of the second insulating section; and
   etching the pixel definition layer at locations between the remaining portions of the insulating film, wherein each of the dams comprises a remaining portion of the pixel definition layer.

4. The method of claim 1,
wherein the bending region is partially exposed between the remaining dams.

\* \* \* \* \*